(12) United States Patent
Field et al.

(10) Patent No.: US 7,585,377 B2
(45) Date of Patent: Sep. 8, 2009

(54) CRITICAL CURRENT DENSITY IN $NB_3SN$ SUPERCONDUCTING WIRE

(75) Inventors: Michael Field, Jersey City, NJ (US); Jeff Parrell, Roselle Park, NJ (US); Youzhu Zhang, East Brunswick, NJ (US); Seungok Hong, New Providence, NJ (US)

(73) Assignee: Oxford Superconducting Technology, Carteret, NJ (US)

( * ) Notice: Subject to any disclaimer, the term of this patent is extended or adjusted under 35 U.S.C. 154(b) by 24 days.

(21) Appl. No.: 12/074,714

(22) Filed: Mar. 4, 2008

(65) Prior Publication Data

US 2008/0274903 A1 Nov. 6, 2008

Related U.S. Application Data

(63) Continuation-in-part of application No. 11/063,334, filed on Feb. 22, 2005, now Pat. No. 7,368,021.

(60) Provisional application No. 60/545,958, filed on Feb. 19, 2004.

(51) Int. Cl.
*H01L 39/04* (2006.01)

(52) U.S. Cl. .............................. 148/98; 29/599; 29/825; 174/125.1

(58) Field of Classification Search ........................ None
See application file for complete search history.

(56) References Cited

U.S. PATENT DOCUMENTS

| | | | | | |
|---|---|---|---|---|---|
| 3,905,839 | A | * | 9/1975 | Benz ........................... | 148/98 |
| 4,262,421 | A | * | 4/1981 | Bergler et al. ................. | 30/393 |
| 4,414,428 | A | * | 11/1983 | McDonald ............... | 174/125.1 |
| 4,776,899 | A | * | 10/1988 | Murase et al. ................ | 148/98 |
| 4,973,365 | A | * | 11/1990 | Ozeryansky et al. .......... | 148/98 |
| 5,088,183 | A | * | 2/1992 | Kanithi ........................ | 29/599 |
| 6,543,123 | B1 | * | 4/2003 | Wong ........................... | 29/599 |
| 6,981,309 | B2 | * | 1/2006 | Hong et al. ................... | 29/599 |
| 2002/0006527 | A1 | * | 1/2002 | Kubo .......................... | 428/662 |
| 2002/0194724 | A1 | * | 12/2002 | Wong ........................... | 29/599 |
| 2005/0281700 | A1 | * | 12/2005 | Egawa et al. ................... | 419/4 |

OTHER PUBLICATIONS

Lee and Larbalestier, Microstructure, Microchemistry and the Development of Very High Nb3Sn Layer Critical Current Density, IEEE Trans. Applied Superconductivity, Paper 4MR01 Published at ASC '04, pp. 1-4, Jacksonville, FL.*

* cited by examiner

*Primary Examiner*—John P. Sheehan
(74) *Attorney, Agent, or Firm*—Klauber & Jackson, LLC

(57) ABSTRACT

Critical current densities of internal tin wire having values of at least 2000 A/mm$^2$ at temperature of 4.2 K and in magnetic field of 12 T are achieved by controlling the following parameters in a distributed barrier subelement design: wt % Sn in bronze; atomic Nb:Sn; local area ratio; reactable barrier; and barrier thickness relative to the filament thickness; and the design for restacking and wire reduction to control the maximum filament diameter at the subsequent heat reaction stage.

13 Claims, 4 Drawing Sheets

US 7,585,377 B2

CRITICAL CURRENT DENSITY IN NB₃SN SUPERCONDUCTING WIRE

RELATED APPLICATION

This application is a continuation-in-part of U.S. patent application Ser. No. 11/063,334, filed Feb. 22, 2005, now U.S. Pat. No. 7,368,021. The latter claims priority from U.S. Provisional Application No. 60/545,958 filed Feb. 19, 2004.

FIELD OF INVENTION

This invention relates generally to superconducting materials and processes for their manufacture, and more specifically relates to critical current density in $Nb_3Sn$ superconducting wire.

BACKGROUND OF INVENTION

At present, there are two basic fabrication routes for the production of $Nb_3Sn$ superconducting wire. The most common is the "bronze route", so called because it features Nb filaments processed in a bronze (copper-tin) matrix. Bronze route wire is responsible for the bulk of $Nb_3Sn$ wire production in the world today. It is popular because despite the need for intermediate anneals, the production process is rather straightforward and amenable to large lot sizes. For uses requiring higher superconducting critical current levels, the "internal tin" process, so called because the tin is separate from the copper until the final heat treatment step, is used because it can deliver several times the supercurrent at high magnetic fields compared to the bronze process wires. This is because the internal tin process allows the creation of wire having more tin, and thus the capability to provide more $Nb_3Sn$ in the final wires' cross section. This invention pertains to improvements in the "internal tin" method of $Nb_3Sn$ wire production.

An important performance measure for superconducting wire is the critical current density, $J_c$, which is defined as the maximum electric current a wire can carry divided by the cross sectional area (or some defined fraction of the area) of the wire. A common form for expressing the critical current density is the non-copper critical current density, where the dividing area is all but the stabilizing copper. The $J_c$ of $Nb_3Sn$ superconducting strand made by the "internal Sn" process (which is primarily a composite made of Cu, Nb, and Sn and/or their alloys) strongly depends on the fraction of Nb and Sn available in the wire cross section. Generally, the higher the fraction of Nb and Sn within the wire, the higher is the fraction of the wire that can be converted to the $Nb_3Sn$ superconducting phase by strand heat treatment. As a result, modern designs for high $J_c$ $Nb_3Sn$ strand made by the internal Sn process consist of high Nb and Sn fractions, and a low amount of Cu.

Although a wire with the highest theoretical $J_c$ would therefore be made of only Nb and Sn in a stoichiometric 3:1 atomic ratio (since this would maximize the amount of $Nb_3Sn$ in the cross section and minimize the fraction of non-superconducting Cu), in practice a certain amount of Cu is required in the cross section. The copper within the superconducting package or "subelement" serves several purposes, including:

1. Cu makes the wire easier to process because it has a hardness level between that of harder Nb and softer Sn. Cu is thus placed amongst the filaments, between the Sn core and Nb filaments, and between the subelements, to aid in the drawing process.
2. A small amount of Cu is needed to reduce the reaction temperature required for converting the Nb and Sn to $Nb_3Sn$. This is desirable for obtaining $Nb_3Sn$ microstructures that result in high $J_c$, and is also desirable from a device manufacturing point of view.

The Cu also has an additional function, one that is relevant to the present invention:

3. Cu between the Nb filaments serves as a path for diffusion of Sn, to allow the Sn source to be dispersed throughout the subelements and to all of the Nb filaments. Having adequate Sn locally available to all Nb filaments in a wire during heat treatment is important for reacting the Nb to $Nb_3Sn$, and obtaining a $Nb_3Sn$ microstructure that results in high $J_c$.

Thus the problem of designing high current density $Nb_3Sn$ wires is reduced to incorporating the optimum ratio of Nb, Sn, and Cu components in a package that can be fabricated and heat treated to produce practically useable strand that will be electrically stable as supercurrent approaches its critical value (i.e., so that small inhomogeneities will not cascade the loss of supercurrent appreciable short of its upper bound value, known as a "quench"). The present invention prescribes a design of such a wire and method for producing same. Although many individual components of this invention may have been part of prior art or known in the industry, it is the unique summation and synergistic integration of all the concepts that produces the high critical current density. Some past designs such as the "tube process", as in Murase U.S. Pat. No. 4,776,899, have very high values of Sn wt %/(Sn wt %+Cu wt %) within the diffusion barrier, and other designs had fine filaments with low LAR (infra); and other designs have had distributed diffusion barriers, which is defined as diffusion barriers around each individual subelement separated by copper instead of a single diffusion barrier encasing all subelements; but none addressed all the issues that are critical for effectiveness and provided a solution to such issues. The proof of this uniqueness is that despite many of these individual concepts dating back to mid 1970's, starting with Hashimoto U.S. Pat. No. 3,905,839, the Ser. No. 11/063,334 invention representatively results in a non-copper critical current density of about 3000 A/mm² at 4.2K, 12 Tesla and about 1700 A/mm² at 4.2K, 15 Tesla, which is an improvement of about tenfold from the initial invention of internal tin superconductor wire and approximately 50% increase from the prior art values of the late 1990's.

SUMMARY OF INVENTION

In the applicants' aforementioned Ser. No. 11/063,334 application it is thus disclosed that non-copper critical current densities are obtained in the range of 3000 A/mm² at 4.2K and 12 T in $Nb_3Sn$ superconducting wire produced by the internal tin method by controlling the following parameters in the distributed barrier subelement design: Sn wt %/(Sn wt %+Cu wt %) inside the diffusion barrier; atomic Nb:Sn including and within the diffusion barrier; local area ratio in the filament pack region; reactable Nb diffusion barrier; Nb diffusion barrier thickness relative to the filament radius; addition of a dopant like Ti or Ta to the $Nb_3Sn$; and a restacking and wire reduction to control the maximum filament diameter at the heat treatment stage. Now in accordance with the instant invention, it has been found that provided all of the remaining Ser. No. 11/063,334 processing steps are used, the doping step may be omitted, and useful products can yet be yielded. These products, while not as outstanding as the products of the Ser. No. 11/063,334 process, typically exhibit $J_c$ values of at least 2000 A/mm² at 4.2 K and 12 T, and are therefore deemed useful for a number of applications where good manufacturability is important but where extremely high performance is not required.

DESCRIPTION OF PREFERRED EMBODIMENT

Definition of Key Terms

For purposes of the present specification, the following terms shall have the meaning set forth:

Critical current density—The key figure of merit for a superconductor, this is the maximum measured supercurrent divided by the overall wire diameter at a specified temperature and magnetic field.

Non-copper critical current density—As most $Nb_3Sn$ strand is integrated with a non-superconducting copper stabilizer region, this value removes for comparison the area fraction of copper stabilizer so that the properties of the superconducting package region can be compared between conductors of differing copper stabilizer fractions.

Layer critical current density—A modification of the non-copper critical current density, this value removes both the stabilizing copper on the outside of the diffusion barrier (see infra) and the unreacted residual bronze phase (infra) and void space on the inside of the diffusion barrier. This leaves as the cross sectional area only the amount of $Nb_3Sn$ after reaction. If the quality of the $Nb_3Sn$ phase is poor, it will have a lower critical current density than the same amount of high quality $Nb_3Sn$. The present invention yields high overall critical current density in part because the layer critical current density is higher than previously achieved in $Nb_3Sn$ wires.

Subelement—In a "distributed barrier" design, rods of copper-encased Nb and a tin source are assembled in a diffusion barrier of Nb before restacking in a copper tube. The elements that are grouped together to comprise the final restack are called subelements. It is the restack that is drawn to final wire; the subelements are the key building blocks of the final wire. As ideally this outer Cu tube is inert during the reaction sequence, all the important activity (diffusion and reaction) takes place inside the subelement. Therefore the key features of the present invention are concerned with the metal area and size ratios within the subelement.

Figure 1:
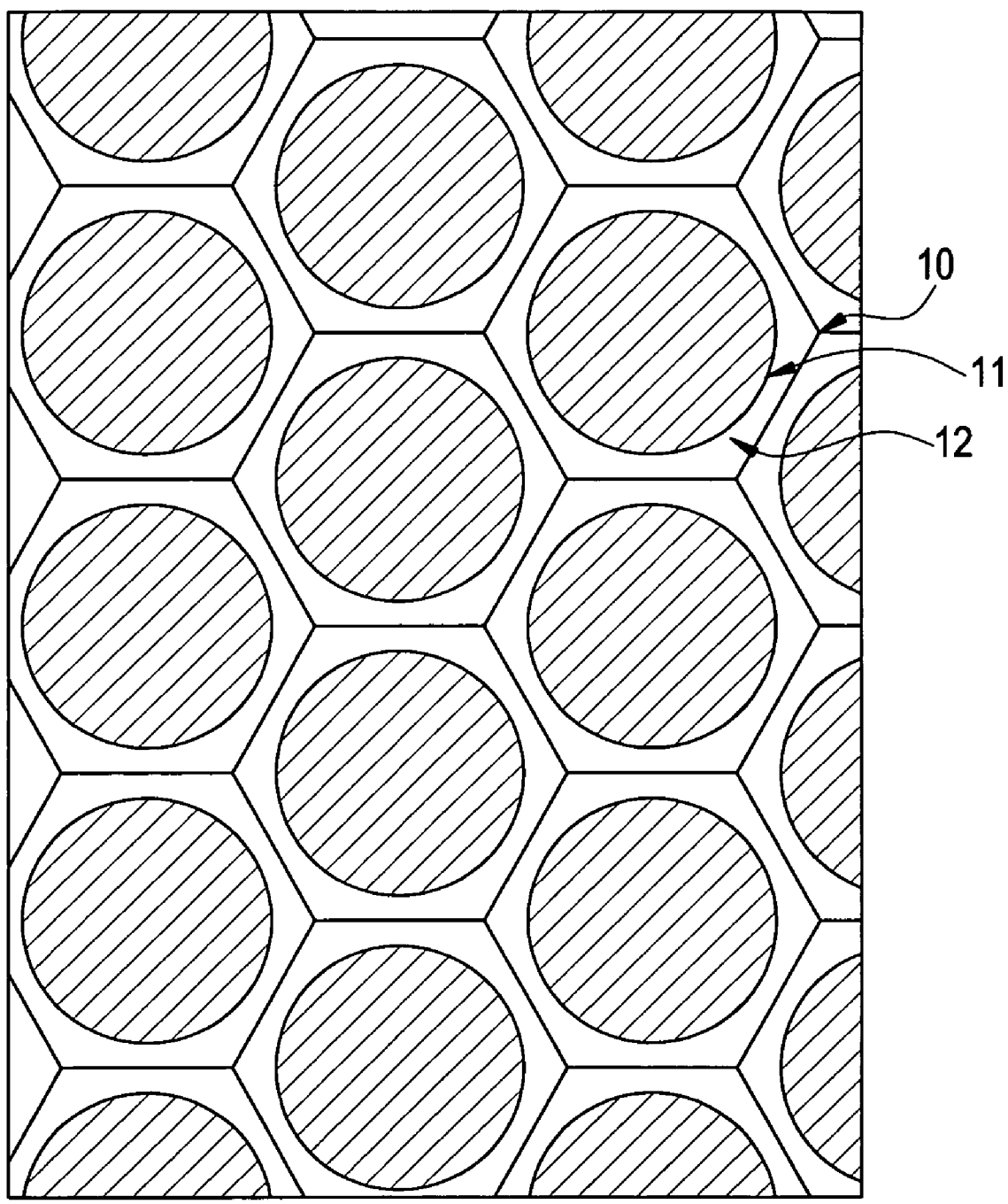
FIG. 1 is an illustration of a filament pack to assist in defining the local area ratio or LAR.
Figure 3:
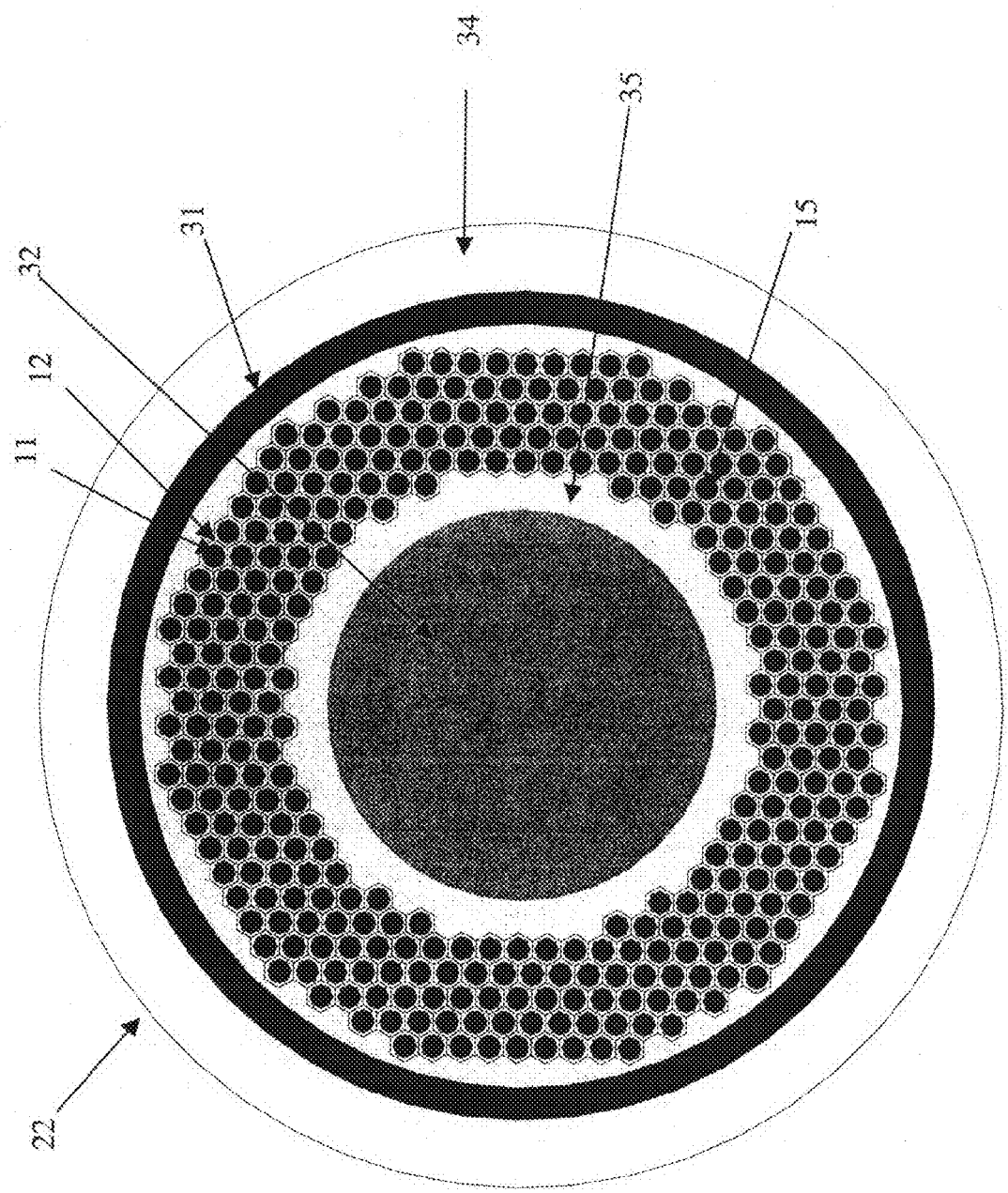
FIG. 3 is an enlarged cross-sectional illustration of one subelement used in the wire of FIG. 2, prior to the wire being subjected to heat treatment.

Local area ratio or LAR—In FIG. 1 there is shown a magnified "local region" of the numerous monofilament rods 10 which in FIG. 3 define the "filament pack region" 15 of subelement 22. Each monofilament rod 10 is composed of Nb 11 and Cu 12. The LAR is the area or volume ratio of the Cu to Nb in the local region of the filament pack region of the subelement. It represents both how closely the Nb filaments are spaced and the width of the Cu channels (necessary for Sn diffusion at the reaction stage). As much of the volume of the subelement is occupied by the Nb filament pack region, the value for the LAR strongly influences the overall fraction of Nb in the conductor.

LAR=Cu area %/Nb area %, with Cu area %+Nb area %=1

Sn wt %/(Sn wt %+Cu wt %) within diffusion barrier—Internal tin wire requires Sn diffusion through Cu to react with the Nb. In doing so various bronze phases are formed, each having specific ratios of Sn and Cu. However when we refer to Sn wt %/((Sn wt %+Cu wt %), we refer to a value that would be the overall weight ratio of Sn to Sn+Cu within the diffusion barrier of the subelement, even if it does not represent a true bronze phase in existence. It is instead used to illustrate how much overall Sn is available to react with the Nb within the subelement.

Atomic Nb:Sn—The atomic ratio of Nb to Sn. Ideally this is 3:1 to form stoichiometric $Nb_3Sn$. If one desires extra unreacted Nb barrier to be left over after the heat treatment sequence, this value needs to be greater than 3:1. A layer of unreacted Nb barrier is often desired to prevent Sn from diffusing into the matrix Cu outside of the diffusion barrier, and lowering the wire residual resistivity ratio (RRR) and stability. If this value is much greater than 3:1, then there is much more Nb in the subelement than is needed to form $Nb_3Sn$ and although the RRR will be high, there is wasted space within the subelement, lowering the non-Cu critical current density.

In the present invention the selection of $Nb_3Sn$ wire design parameters incorporate an understanding of the factors that result in high $J_c$. The design combines high Nb and Sn fractions, necessary to achieve a high $Nb_3Sn$ fraction in the final wire, with a small Cu fraction, but one still suitable to meet the nine objectives listed below. This caveat means that the Cu needs to have the proper distribution and/or alloying elements that result in a thorough conversion of the Nb to a high quality $Nb_3Sn$ microstructure.

For purposes of the present invention, the important materials details of the wire design that influence the $J_c$ thus include:

1. Nb area fraction including and within the Nb diffusion barrier of the subelement
2. Nb to Sn atomic ratio including and within the Nb diffusion barrier of the subelement
3. Area ratio of Sn to Cu within the "non-Cu fraction"—Sn wt %/(Sn wt %+Cu wt %) within the Nb barrier envelope of the subelement
4. Area ratio of Cu and Nb in the filament package (Local Area Ratio)
5. A distributed barrier (infra) approach, as opposed to a single diffusion barrier approach
6. Nb diffusion barrier that can be reacted to form $Nb_3Sn$
7. Ratio of Nb diffusion barrier thickness to filament diameter, and thus the Nb distribution (fractions) between filaments and outer diffusion barrier
8. Nb filament and Nb barrier ring absolute size in final wire
9. Minimization during heat treatment of the dissolution of Nb filament in a Sn rich environment and excessive $Nb_3Sn$ grain growth while fully converting the filaments to $Nb_3Sn$ With regard to item 1, the Nb area fraction needs to be maximized in the non-copper region in the subelement (i.e. inside and including the Nb diffusion barrier), but is limited by the amounts of Cu and Sn simultaneously required in the non-copper region. The Nb fraction comes from the diffusion barrier and the enclosed Nb filament pack region. The individual Nb filaments are created by combining Nb with some form of Cu cladding. Often this is by extrusion of a Nb ingot in a Cu jacket which is reduced and formed to hexagonal cross section by wire drawing for ease of fabrication route but can be formed by wrapping Cu foil on round rods and assembling a pack of round monofilaments. The details of the assembly are not critical to the invention; what is critical is that area fraction of Nb including and within the diffusion barrier is from 50-65% of the area specified.

With regard to item 2, as described earlier, an ideal Nb to Sn atomic ratio within the subelement should be close to the atomic ratio of $Nb_3Sn$, 3:1. However, practical considerations impact this ratio, as full conversion to $Nb_3Sn$ would, because of naturally occurring variations of thickness of the barrier tube, result in tin diffusion to the stabilization matrix. This leakage in turn lowers RRR and stability of the wire, making it difficult to achieve the theoretical critical current without quenching the sample. Therefore in practice this minimum ratio is ~3.3:1, but less than ~3.7:1 to minimize the underutilized wire cross-section consisting of unreacted Nb. A value of below 3:1 does not prevent $J_c$ of at least 2000 A/mm$^2$ (4.2 K, 12 T) if other key parameters are in place, but it does greatly decrease RRR and make it an impractical conductor. The understanding and control of this parameter are part of the utility of this invention.

Figure 4:
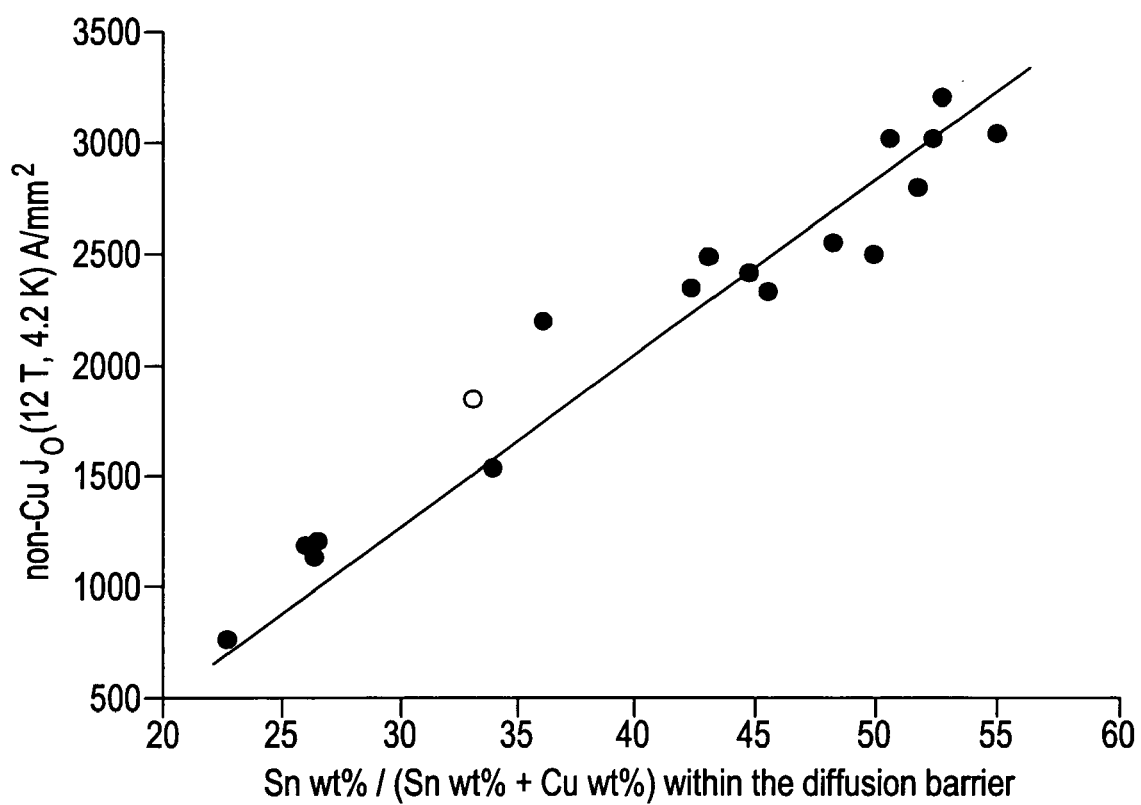
FIG. 4 is a plot of the non-copper critical current density vs. Sn wt %/(Sn wt %+Cu wt %) inside the diffusion barrier for a Ti or Ta doped $Nb_3Sn$.

With regard to item 3, the Sn wt %/(Sn wt %+Cu wt %) within the diffusion barrier is a critical parameter. Values are needed above ~45%, and up to about 65%, but preferably from 50%-60% in order for the Sn to react quickly with the Nb alloy to form very high quality $Nb_3Sn$ phase. With regard to the non-copper $J_c$, the effect of the Sn wt %/(Sn wt %+Cu wt %) within the diffusion barrier in our internal tin wire is illustrated in FIG. 4, and although this plot is for the Ta or Ti doped variant of $Nb_3Sn$, a similar, but lower $J_c$, relationship would pertain to undoped $Nb_3Sn$. A high value of the Sn wt %/(Sn wt %+Cu wt %) within the diffusion barrier, while of paramount importance, cannot guarantee high current density if the other listed criteria are not also observed. In the past, high values of Sn wt %/(Sn wt %+Cu wt %) within the diffusion barrier have existed in prior art "tube process" $Nb_3Sn$ with poor results, for reasons explained as part of this invention.

With regard to item 4, the local area ratio (LAR) needs to be small, preferably in the range of from 0.10 to 0.30. Minimizing LAR is critical to enhancing item 1, the amount of Nb that can be located in the subelement. However LAR must be greater than zero as Cu is needed to act as a diffusion network for tin. The lack of a copper diffusion network in "tube process" internal tin is why that process failed to deliver high $J_c$ despite high Sn wt %/(Sn wt %+Cu wt %) within the diffusion barrier.

Figure 2:
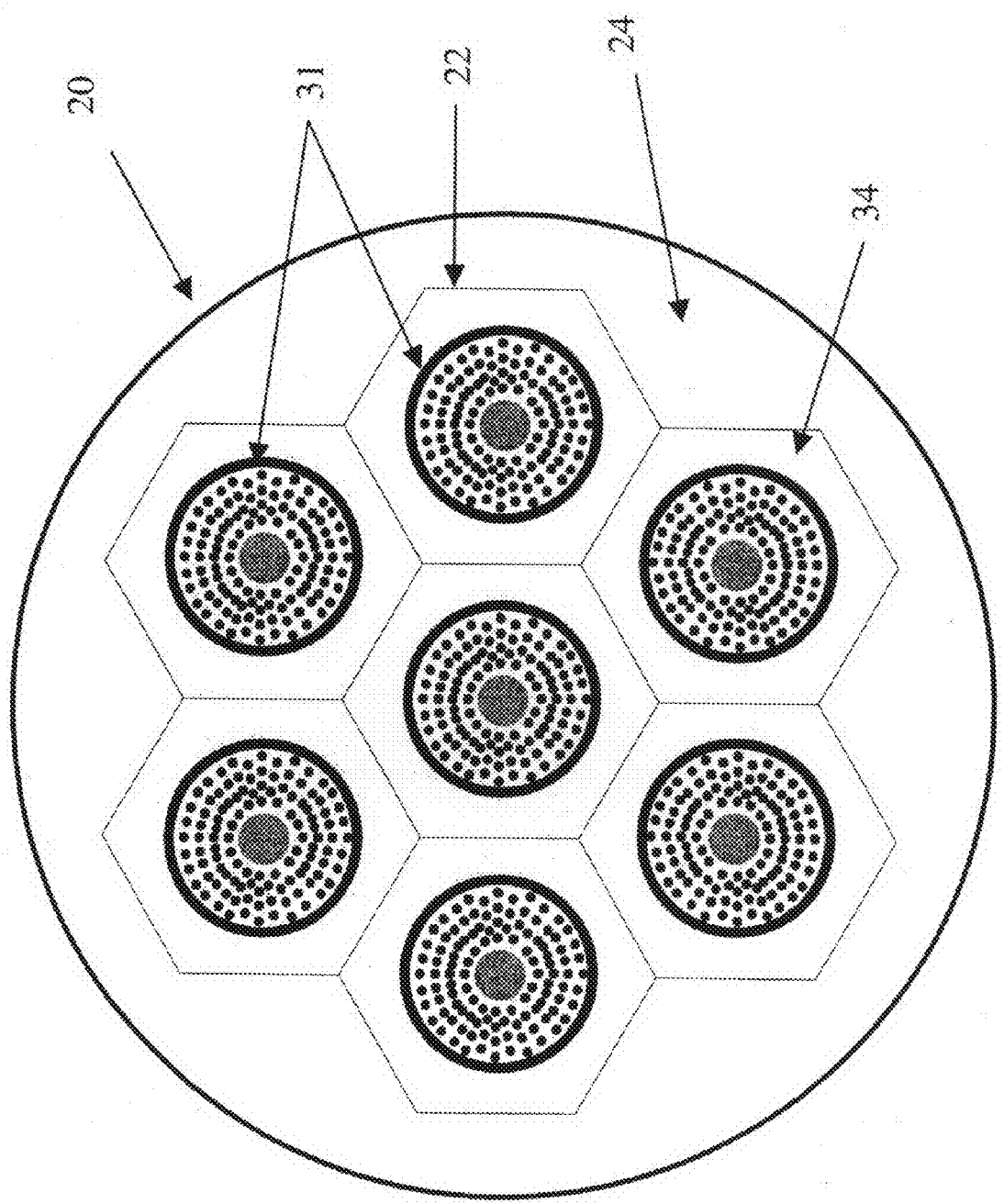
FIG. 2 is a schematic cross-sectional view (not to scale) of a superconductor wire in accordance with the invention, prior to the wire being subjected to heat treatment.

With regard to item 5, a distributed barrier of Nb is used. The term "distributed barrier" refers to a strand design wherein each subelement has its own diffusion barrier, as opposed to a diffusion barrier around the entire collection of subelements as seen in many internal tin wires, such as the internal tin designs proposed for the ITER fusion tokamak project. To our knowledge, the only prior art internal tin wire made in commercial quantities by the distributed barrier method was so-called "Modified Jelly Roll", see U.S. Pat. Nos. 4,262,412 and 4,414,428. The distributed barrier approach allows for lower Cu fractions within the subelement, which enhances the Sn wt %/(Sn wt %+Cu wt %) within the diffusion barrier. This is because in the single barrier approach, due to practical handling concerns, a significant amount of copper must be left on the outside of a subelement before it can be restacked in a barrier, which in turn dilutes the Sn wt %/(Sn wt %+Cu wt %). In the present invention the distributed barrier also provides for a continuous web of high conductivity copper between all of the subelements, enhancing electrical stability. The single barrier construction tends to be electrically meta-stable or unstable with respect to current carrying capacity, especially at higher $J_c$ levels. An illustration of a distributed barrier wire is shown in FIG. 2, where seven subelements 22, each having their own barrier 31 are distributed throughout the cross-section.

With regard to item 6, a reactable Nb ring as the diffusion barrier is key to maximizing the Nb content in the non-copper portion of the wire. Many internal tin wire designs feature an inert Ta diffusion barrier, but this takes up valuable space in the subelement cross-section that if Nb were employed instead could be converted to useful superconductor. The caveat is that the reactable Nb needs to be thick enough so that not all of it reacts, thus preventing tin from diffusing into the copper stabilizer matrix. Achieving this proper balance is part of the utility of this invention.

With regard to item 7, the thickness of the Nb diffusion barrier should be sufficient to ensure that at some stage during the heat treatment, the filaments are fully reacted yet the barrier is only partially reacted; that way additional time in the heat treatment is used to controllably react the fraction of barrier desired. However it should not be too thick or the non-copper region will have too large a fraction of unreacted Nb, reducing the non-copper $J_c$. Preferably the barrier thickness to filament radius should be between the range of 1:1 to 6:1. The relationship between the thickness of the barrier and the filaments also dictates the barrier fraction of the non-copper portion of the subelement.

With regard to item 8, the absolute size of the filaments and barrier is critical in determining if the Nb will react completely within a practical heat treatment time. Typically for internal tin heat treatments, longer and/or higher temperature heat treatments will result in larger $Nb_3Sn$ grain sizes and reduced layer critical current density at moderate magnetic fields, i.e. 12-16 Tesla. Therefore smaller Nb filaments will allow a heat treatment to be chosen to minimize grain size throughout a fully reacted filament, yet react the barrier not fully but instead ~50-90%. Typically this Nb filament diameter should be at least 0.5 μm but no more than 7 μm in the finished wire condition and preferably from 1 μm to 5 μm.

With regard to item 9, the selection of the proper heat treatment is the final step needed to produce a high $J_c$ conductor. It is possible to choose all the proper design parameters but over or under react the wire by heat treatment so as to achieve less than optimum $J_c$ values. The heat treatment must be chosen so as to react all of the filaments and most, but not all of the diffusion barrier. This must be determined empirically as the optimal heat treatment for a fixed wire design varies by subelement size and thus wire diameter. Essentially independent of wire diameter, the first two sequences are typically 210° C. for ~48 hrs. and 400° C. for ~48 hrs. These two steps are needed to form the bronze phases and start the tin diffusion through the copper matrix. If these steps are omitted, the wire is subject to tin bursting, and if they are too lengthy, the tin rich bronze phases can dissolve Nb in the inner filament ring, reducing the Nb available for reaction. For subelements larger than ~100 μm in finished wire, a 570° C. sequence for ~48 hrs. is helpful to aid in tin diffusion. The Nb₃Sn formation step is optimal between 625° C. and 725° C., with the length on the order of 10 to >200 hours, depending on subelement size. A heat treatment study is needed to establish the optimal heat treatment per wire design.

In accordance with the present invention, the following parameters have been found to be instrumental in producing the desired properties in the subelements which are incorporated into the composite wire structures: Sn wt %/(Sn wt %+Cu wt %) within the diffusion barrier is at least 45%, preferably 50-55%; and atomic Nb:Sn equal or greater than 2.7 but not more than 3.7, preferably about 3.45; and LAR is from 0.25 to 0.1; and a distributed barrier design; and a barrier that is reactable to Nb₃Sn (i.e., Nb); and a barrier that is thicker than the Nb filament 11 radius from FIG. 1; and a design of restacking and wire reduction so that the filament diameter is approximately 3 microns at the reaction stage. All of these parameters are required to be present in order to assure that the final heat treated strand will exhibit a current density of 2000 A/mm² or greater.

In FIG. 2 a schematic cross-section is shown of a wire 20, which following heat treatment will comprise a multifilamentary superconductor. The wire 20 is not shown to scale, but essentially consists of a plurality of subelements 22 which are packed in a copper matrix 24. Note the shape of the subelement 22 at restack in this schematic is hexagonal, but in FIG. 3 it is round. Such shapes are commonly used to aid assembly of superconducting wire, and are achieved by wire drawing using shaped metalworking dies. Still, the subelement 22 can be any shape convenient for restacking, and this restacking shape is not critical to achieve the high critical current density. The number of subelement hex rods in FIG. 2 is seven; but this can vary from 1 to >100. Wire 20 is in its final form; as is known in the art the predecessor subassemblies have themselves undergone a series of restacks with copper-encased Nb rods, and then mechanical working including drawing to reduce the subassemblies 22 to the configuration shown in FIGS. 1 and 2. The Cu 24 outside subelements 22 is typically 20%-60% of the final wire area, but could be more or less depending on the application. This value does not affect the critical current density of the subelements, only the total supercurrent of the wire.

Individual subelements 22 are best seen in the enlarged cross-sectional in FIG. 3. The subelement is generally manufactured within a copper jacket 34. For determining the key metal ratios of the subelement, only the metal ratios including and within the Nb barrier 31 are considered. This is to be defined as the non-Cu portion of the subelement. The subelement 22 includes a Sn or Sn alloy center 32. This alloy is almost entirely Sn; it typically includes less than 1% by weight of Cu, though other Sn alloys are possible. Sn alloy center 32 constitutes about 23% to 27% of the non-copper area of the subelement. Each subelement 22 includes a plurality of Nb filaments 11 encased in a surrounding layer of copper 12. Copper 35 also surrounds the Sn based center 32. The local area ratio referred to as "LAR", is that ratio within the Nb filament rod region 15 of the intervening copper 12 and the filaments 11. A Nb barrier 31 is also seen to be present in each subelement 22, whose role is both to prevent the Sn from substantial diffusion into the copper-filled stabilizing regions 34 between subelements 22 and to partially react to Nb₃Sn contributing to the critical current density. The area sum of the all the copper within the diffusion barrier 31 constitutes about 15% to 25% of the subelement area.

During the initial 210° C. stage of the heat treatment of wire 20, the Sn diffuses into the copper matrix, e.g., starting at 35, forming high Sn % bronze phases. During the 400° C. heat treatment stage, Sn further diffuses from 35 to the intervening copper 12. If the wire is heated directly to the Nb₃Sn reaction stage without these pre-reaction sequences, the rapid conversion of tin from solid to liquid can lead to rapid differential expansion and tin bursting through the subelement. Note that part of the utility of this invention is that subelements of high Nb and Sn wt %/(Sn wt %+Cu wt %) can be successfully converted by heat treatment to form a large volume fraction of high quality Nb₃Sn. Allocation of some Nb in both the reactable diffusion barrier and within a copper web containing Nb filaments is of prime importance to achieve a wire capable of high $J_c$ without the wire suffering from Sn bursting out of the subelement during heat treatment. This invention thus eliminates a defect of the "tube process" whereby high Sn wt %/(Sn wt %+Cu wt %) wires suffered from tin burst.

For subelements larger than ~100 μm, a 570° C. sequence for ~48 hrs. can be added to aid in tin diffusion to the filaments furthest from the tin source. During the 625° C. to 725° C. heat treatment stage, Cu—Sn phases react rapidly with the Nb filaments 11. The Nb barrier 31 also reacts during the 625° C. to 725° C. stage to contribute to the non-copper critical current density. The degree of barrier reaction is controlled by the temperature and length of the final heat treatment stage; it is up to end user to trade off between critical current density and RRR, as increased reaction time will eventually lead to decreased RRR. The Nb filaments 11 and barrier 31 constitute about 55% to 60% of the subelement area.

Table 1 summarizes the key parameters necessary to create the wire of this invention.

TABLE 1

| Parameter | Range | Preferred Range |
|---|---|---|
| Total Nb content | 50-65% of Non-Cu | 55-60% of Non-Cu |
| Sn wt %/((Sn wt % + Cu wt %) within the diffusion barrier | 45-65% | 50-60% |
| Local Area Ratio | 0.10-0.30 | 0.15-0.25 |
| Nb to Sn atomic ratio | 2.7-3.7 | 3.1-3.6 |
| Nb filament diameter | 0.5-7 microns | 1-5 microns |
| Nb diff. barrier thickness | 0.8-11 microns | 1.5-8 microns |
| Nb barrier fraction of Nb | 20-50% | 25-35% |

While the present invention has been described in terms of specific embodiments thereof, it will be understood in view of the present disclosure, that numerous variations upon the invention are now enabled to those skilled in the art, which variations yet reside within the scope of the present teaching. Accordingly, the invention is to be broadly construed, and limited only by the scope and spirit of the claims now appended hereto.

The invention claimed is:

1. A method for producing a multifilament Nb₃Sn superconducting wire having a $J_c$ values of at least 2000 A/mm² at 4.2 K and 12 T, comprising the steps of:
   a) packing a plurality of Cu encased Nb rods within a first Cu containing matrix which is surrounded by an intervening Nb diffusion barrier and a second Cu containing matrix on the other side of the barrier remote from said rods, to thereby form a packed subelement for said superconducting wire;
   b) providing a source of Sn within said subelement;
   c) assembling said metals within the subelement, the relative sizes and ratios of Nb, Cu and Sn being selected such that
      (1) the Nb fraction of the subelement cross section including and within the said diffusion barrier is from 50 to 65% by area;

(2) the atomic ratio of the Nb to Sn including and within the said diffusion barrier of the subelement is from 2.7 to 3.7;

(3) the ratio of the Sn to Cu within the said diffusion barrier of the subelement is such that the Sn wt %/(Sn wt %+Cu wt %) is 45%-65%;

(4) the Cu to Nb local area ratio (LAR) of the said Cu-encased Nb rods is from 0.10 to 0.30;

(5) the said Nb diffusion barrier being fully or partially converted to $Nb_3Sn$ by subsequent heat treatment; and (6) the thickness of said Nb diffusion barrier is greater than the radius of the Nb portions of said Cu encased Nb rods; and d) assembling said subelements in a further matrix of Cu and reducing said assemblage to wire form such that (1) said multifilamentary $Nb_3Sn$ superconducting wire is comprised of a plurality of said subelements, each having a Nb diffusion barrier to thereby form a wire having a distributed barrier design;

(2) the Nb portions of the said copper encased Nb rods in the final wire are of diameter from 0.5 to 7 μm before reaction, and (3) said Nb diffusion barrier that is fully or partially converted to $Nb_3Sn$ by heat treatment is from 0.8 to 11 μm thickness before reaction; and e) heat treating the final size wire from step d) to form the $Nb_3Sn$ superconducting phases.

2. A method in accordance with claim 1 where the Nb or Cu or Sn is alloyed with an element or compound for the purpose of strengthening the composite.

3. A method in accordance with claim 1, wherein the Nb fraction of the subelement is from 55% to 60% by area of the said cross section area of the subelement including and within the said diffusion barrier.

4. A method in accordance with claim 1, wherein the Nb barrier fraction of the total Nb content of the subelement is from 20-50%.

5. A method in accordance with claim 4, wherein the Nb barrier fraction of the total Nb content of the subelement is from 25-35% by area.

6. A method in accordance with claim 1, wherein the atomic ratio of the Nb to Sn alloy in the subelement is from 3.1 to 3.6.

7. A method in accordance with claim 1, wherein the ratio of the copper to tin alloy in the subelement is such that the Sn wt %/(Sn wt %+Cu wt %) within the diffusion barrier is from 50 to 60%.

8. A method in accordance with claim 1, wherein the Cu to Nb local area ratio of the said copper-encased Nb rods is from 0.15 to 0.25.

9. A method in accordance with claim 1, wherein the Nb portions of the said copper encased Nb rods in the final wire are from 1-5 μm diameter before reaction.

10. A method in accordance with claim 1, wherein the Nb diffusion barrier that is fully or partially converted to $Nb_3Sn$ by heat treatment is from 1.5-8 μm thick before reaction.

11. A method in accordance with claim 1, wherein the Sn is diffused into said Nb rods by a heat treatment process that minimizes dissolution of the Nb in the annulus region with pre-reaction stages at 180° C.-220° C. for 24-100 hours, followed by 340°-410° C. for 24-50 hours, followed by $Nb_3Sn$ formation stage at 625° C.-725° C. for 12-200 hours, the soak times at each of the three stages of heat treatment being chosen to maximize conversion of the Nb and Sn to form the superconducting $Nb_3Sn$ phase, while allowing nearly but not complete reaction of the Nb diffusion barrier.

12. A method in accordance with claim 10, wherein a fourth stage is added to the heat treatment sequence prior to the $Nb_3Sn$ reaction stage, of 560°-580° C. for 24-200 hours.

13. A method in accordance with claim 1, wherein the Cu encased Nb rods are formed into hexagonal cross sectioned rods for use in packing the subelement.

* * * * *